(12) United States Patent
Sumesaglam

(10) Patent No.: US 12,705,197 B2
(45) Date of Patent: Aug. 11, 2026

(54) TEMPERATURE AND VOLTAGE INSENSITIVE CROSSTALK CANCELLATION

(71) Applicant: Intel Corporation, Santa Clara, CA (US)

(72) Inventor: Taner Sumesaglam, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/942,516

(22) Filed: Sep. 12, 2022

(65) Prior Publication Data

US 2024/0086352 A1 Mar. 14, 2024

(51) Int. Cl.
*G06F 13/38* (2006.01)
*H03K 5/1252* (2006.01)

(52) U.S. Cl.
CPC .......... *G06F 13/38* (2013.01); *H03K 5/1252* (2013.01); *G06F 2213/40* (2013.01)

(58) Field of Classification Search
CPC .... G06F 2213/40; G06F 13/38; H03K 5/1252
See application file for complete search history.

(56) References Cited

U.S. PATENT DOCUMENTS 10,771,108 B1 * 9/2020 Fazeel .................. H10D 84/811
2013/0147547 A1 * 6/2013 Nalawade .............. G06F 30/36 327/551
2016/0142810 A1 * 5/2016 Freitas ................ H04R 1/1041 381/74
2017/0083475 A1 * 3/2017 Wu .......................... G06F 1/10
2021/0058078 A1 * 2/2021 Fujita ................... H03K 5/1252
2021/0408970 A1 * 12/2021 Hong .................. H03F 3/45744
2023/0421951 A1 * 12/2023 Zhou ........................ H04R 3/12

* cited by examiner

*Primary Examiner* — Henry Tsai
*Assistant Examiner* — Harry Z Wang
(74) *Attorney, Agent, or Firm* — Schwegman Lundberg & Woessner, P.A.

(57) ABSTRACT

An improved circuit for crosstalk cancellation may be used to provide improved receiver crosstalk cancelation. These solutions may include a high-pass filter that is configured to be matched to victim path. These solutions may reduce or eliminate the use of a unity gain buffer and in-line high-pass filter, which may reduce design complexity and improve performance. These solutions provide crosstalk cancellation that requires less power, is less complex, is less sensitive to temperature and voltage, and is more effective at providing crosstalk cancellation. This improved crosstalk cancellation further provides channel eye height improvement, reduced EHI temperature sensitivity, reduced EHI voltage sensitivity, reduced design complexity, and reduced silicon circuit area.

19 Claims, 7 Drawing Sheets

TEMPERATURE AND VOLTAGE INSENSITIVE CROSSTALK CANCELLATION

TECHNICAL FIELD

Embodiments described herein generally relate to electronic signal crosstalk cancellation.

BACKGROUND

In digital and analog communication systems, a given communication channel may be affected by crosstalk interference from one or more signals from multiple communication channels. This crosstalk interference may be caused by undesired electromagnetic coupling among nearby communication channels, such as from conductive, capacitive, or inductive coupling among nearby conductors.

For computer bus interfaces such as double data rate (DDR), the interfaces are providing communication using increasingly high speeds (e.g., 7200 MTs and higher). Crosstalk cancellation is increasingly important in enabling communication at these increasingly high speeds, particularly crosstalk cancellation at the receiver side. In increasingly high speed transceivers, crosstalk from neighboring lanes degrades the received channel eye pattern even further, and it makes harder to detect incoming bits correctly. DDR input and output (e.g., DDR I/O) may be particularly sensitive to shifts in threshold voltage ($V_T$), as may DDR I/O parameters may be trained once at start-up, and any $V_T$ shift results in a performance loss. What is needed is an improved receiver crosstalk cancellation solution.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

Technical solutions described herein include an improved circuit for crosstalk cancellation, such as for receiver crosstalk cancelation. These solutions may include a high-pass filter that is configured to be matched to victim path. These solutions may reduce or eliminate the use of a unity gain buffer (UGB) combined with an in-line high-pass filter, which may reduce design complexity and improve performance. These solutions provide crosstalk cancellation that requires less power, is less complex, is less sensitive to temperature and voltage, and is more effective at providing crosstalk cancellation. In some examples, these solutions provide channel eye height improvement (EHI) (e.g., increased eye pattern voltage range), a reduced EHI temperature sensitivity, a reduced ERE voltage sensitivity, a reduced design complexity, and a reduced silicon circuit area.

In the following description, for purposes of explanation, numerous specific details are set forth to provide a thorough understanding of some example embodiments. It will be evident, however, to one skilled in the art that the present disclosure may be practiced without these specific details.

Figure 1:
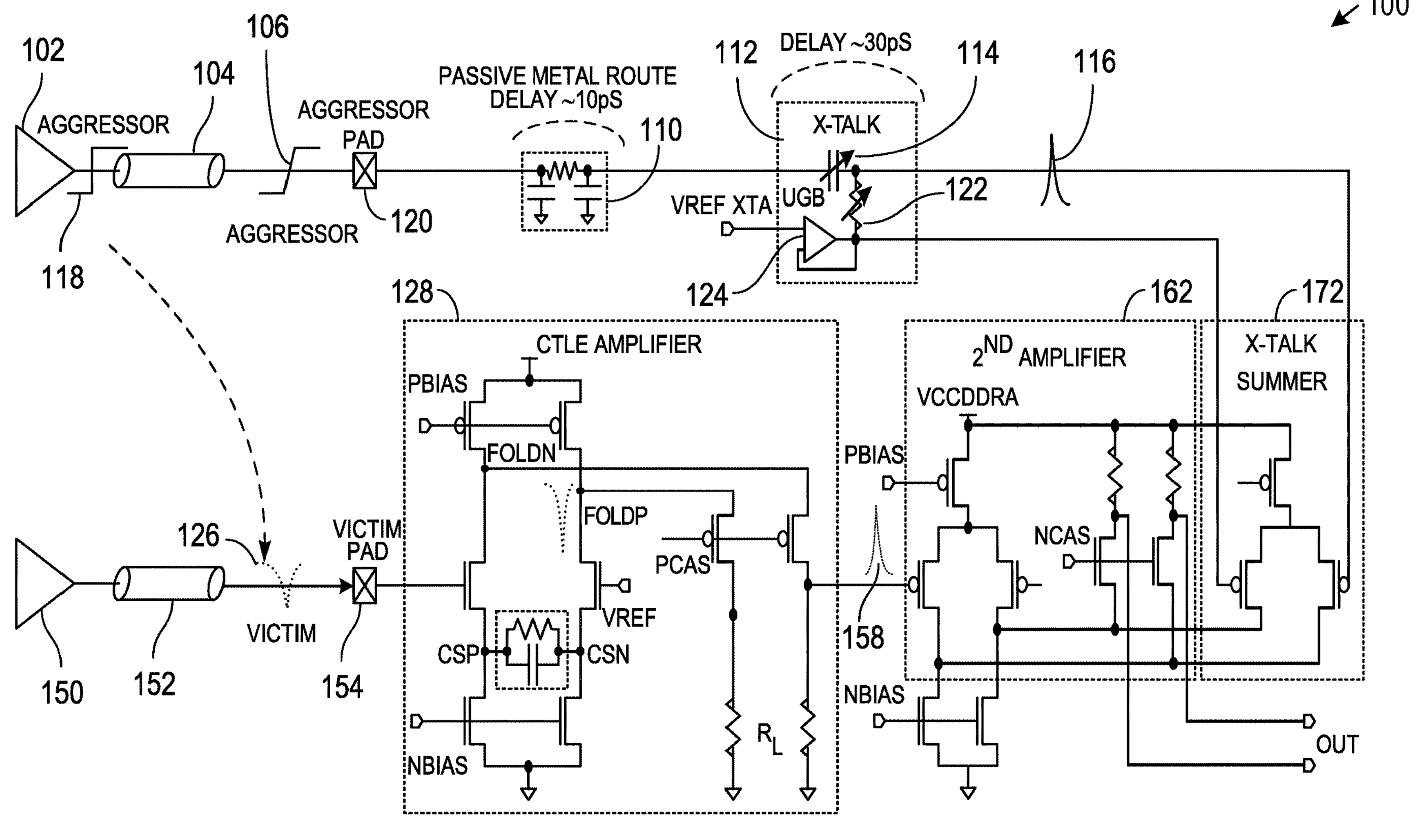
FIG. 1 is a block diagram illustrating a first crosstalk cancellation system, according to an embodiment.

FIG. 1 is a block diagram illustrating a first crosstalk cancellation system 100, according to an embodiment. System 100 shows an aggressor transmitter 102 that provides a digital bit signal 118 to a transmission channel 104, and convey a transmitted bit signal 106 to an aggressor receiver pad 120. In parallel, a victim transmitter 150 transmits through a victim transmission channel 152 to a victim pad 154. Any transition in the digital bit signal 118 may result in a crosstalk interference pulse 126 visible at the victim pad 154.

To reduce or eliminate the crosstalk interference pulse 126, system 100 includes an aggressor crosstalk circuit 112. The aggressor crosstalk circuit 112 includes a crosstalk capacitor 114 and resistor 122 that form a high-pass filter. The capacitor 114 will block direct current (DC) information from the digital bit signal 118, and only allow the transition of the digital bit signal 118 to pass through and generate an aggressor pulse 116.

The aggressor pulse 116 is provided to a crosstalk summation circuit 172, where crosstalk summation circuit 172 includes a common-source amplifier circuit. The aggressor crosstalk circuit 112 also includes a UGB 124 that adjusts the common mode provided to crosstalk summation circuit 172. The crosstalk summation circuit 172 functions with a CTLE amplifier circuit 128 and a second amplifier circuit 162 to generate a crosstalk cancellation pulse 158 to cancel the crosstalk interference pulse 126.

The circuity within system 100 may cause signal propagation delays. System may include a passive metal route 110, which may induce a propagation delay of about 10 picoseconds. The aggressor crosstalk circuit 112 may cause a propagation delay of about 30 picoseconds (pS). These are example delays, through other delays may be caused by the passive metal route 110 and the aggressor crosstalk circuit 112. The second amplifier circuit 162 and the crosstalk summation circuit 172 may work together to match the delay from the aggressor pulse 116 to the timing of the crosstalk interference pulse 126.

Figure 2:
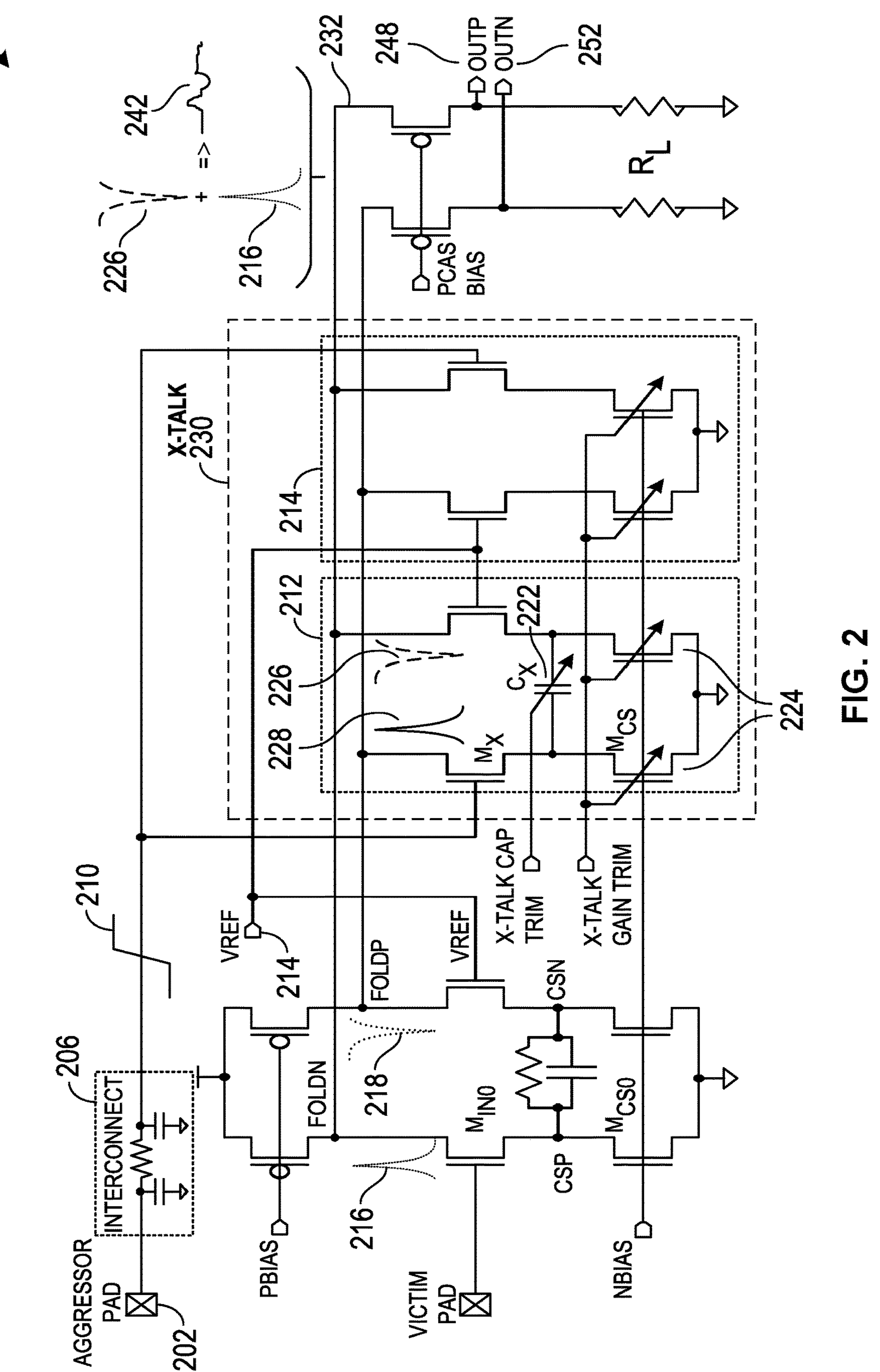
FIG. 2 is a block diagram illustrating a second crosstalk cancellation system, according to an embodiment.

FIG. 2 is a block diagram illustrating a second crosstalk cancellation system 200, according to an embodiment. System 200 shows an aggressor lane that includes an aggressor pad 202 and interconnect 206. A transmitted bit signal 210 is routed from the interconnect 206 to a crosstalk cancellation circuit 230. The bit transitions of transmitted bit signal 210 may cause a positive differential pulse signal 216 and a corresponding negative differential pulse signal 218. System 200 includes a crosstalk cancellation circuit 230 coupled to passively receive the transmitted bit signal 210 and generate a negative crosstalk cancellation pulse 226 and positive crosstalk cancellation pulse 228. In an example, signal line 232 combines the negative crosstalk cancellation pulse 226 with the positive differential pulse signal 216 to form a cancelled signal 242, which is output at a first differential output 248. Similarly, positive crosstalk cancellation pulse 228 and corresponding negative differential pulse signal 218 are combined at a second differential output 252.

The crosstalk cancellation circuit 230 includes a first differential pair amplifier circuit 212 and a second differential pair amplifier circuit 214. The first differential pair amplifier circuit 212 may be a capacitively source-degenerated differential pair amplifier with tunable capacitor $C_x$ 222 that functions as a high-pass filter. The tunable capacitor $C_x$ 222 may receive a crosstalk capacitor trim input that adjusts the cutoff frequency of the high-pass filtering of negative crosstalk cancellation pulse 226 and of the positive crosstalk cancellation pulse 228. The first differential pair amplifier circuit 212 may also include a pair of tunable transistors $M_{cs}$ 224 that receive a crosstalk gain trim, where the crosstalk gain trim adjusts the gain of the negative crosstalk cancellation pulse 226 and of the positive crosstalk cancellation pulse 228. The second differential pair amplifier circuit 214 may also include a pair of tunable transistors $M_{cs}$ that further adjust the gain of the negative crosstalk cancellation pulse 226 and of the positive crosstalk cancellation pulse 228.

The second differential pair amplifier circuit 214 may be used to reduce or minimize low-frequency gain through finite output resistance (1/ $gds_{sc}$) of the bottom current sources. For an input crosstalk transconductance $gm_x$, the transfer function for the crosstalk cancellation circuit 230 may be expressed as follows:

$$H_x(s) \cong \left(\frac{gm_x(gds_{cs}+sC_x)}{gds_{cs}+gm_x+sC_x} - \frac{gm_x gds_{cs}}{gds_{cs}+gm_x}\right)R_L$$

The crosstalk transfer gain ($H_x$) reduces to zero at low frequency (with s=0) as follows:

$$H_x(s=0)=0 \qquad \text{Low-frequency gain}$$

$$H_x(s=\infty)=gm_xR_L \qquad \text{High-frequency gain}$$

In contrast with the aggressor lane high-pass filter and UGB included in system 100, the high-pass filtering and gain functionality within system 200 are provided within the crosstalk cancellation circuit 230. By using tunable capacitor Cx 222 within system 200 to provide high-pass filtering within crosstalk cancellation circuit 230, system 200 provides crosstalk cancellation pulses that are better matched to the victim. Additionally, system 200 provides improved performance in the presence of voltage or temperature shifts, especially when compared to system 100 that includes a victim-side CTLE amplifier circuit 128 and an aggressor crosstalk circuit 112.

System 200 provides improved performance over systems that require a UGB, such as the UGB 124 in system 100. To support crosstalk cancellation for high-speed data, any UGB needs to function at frequencies at least as high as the Nyquist frequency associated with the high-speed data rate, such as supporting 4.4 GHz for 8800 MTs. Any UGB also needs to have an associated resistance that is negligible (e.g., orders of magnitude below) compared to the high-pass resistor element (e.g., resistor 122) to achieve the desired high-bandwidth and the desired high-pass corner frequency. Any UGB requires a crosstalk voltage reference input to provide proper a common-mode for the UGB. Any UGB also requires an offset cancellation scheme or low offset, otherwise the uncancelled offset may reduce or eliminate any benefit of crosstalk cancellation. System 200 provides improved performance over crosstalk cancellation systems that require a UGB.

Figures 3A, 3B:
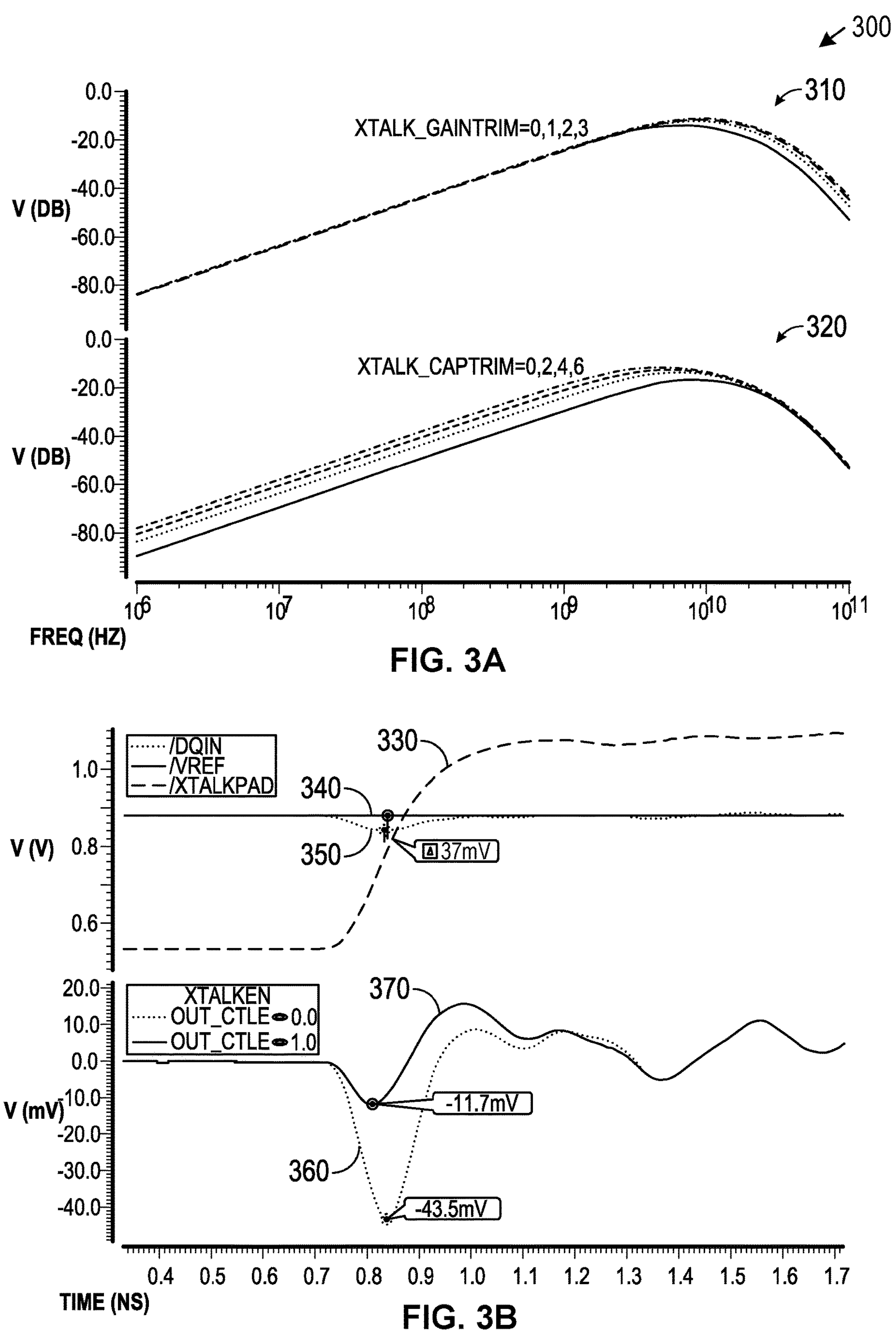
FIGS. 3A-3B are graphs illustrating crosstalk signal performance, according to an embodiment.

FIGS. 3A-3B are graphs illustrating crosstalk signal performance 300, according to an embodiment. FIG. 3A shows crosstalk frequency response for various values of crosstalk gain trim 310 and crosstalk capacitor trim 320, such as may be used by tunable transistors $M_{cs}$ 224 and tunable capacitor $C_x$ 222, respectively. The frequency response for each of the values of crosstalk gain trim 310 and crosstalk capacitor trim 320 increases until about 7-10 GHz, after which the frequency response exhibits roll-off and attenuation.

The crosstalk step response shown in FIG. 3B shows example simulated input and outputs of the improved crosstalk cancellation system. An aggressor signal 330 is shown crossing a reference voltage level 340. The aggressor signal 330 affects the crosstalk input signal 350, causing a temporary voltage reduction with an amplitude of −37 millivolts (mV). Crosstalk receiver signal 360 shows the receiver-side signal without using crosstalk cancellation, where the temporary voltage reduction at the input may be amplified to −43.5 mV at the receiver output. Crosstalk cancelled receiver signal 370 shows the receiver-side signal with crosstalk cancellation applied, where the temporary voltage reduction at the input is reduced from −43.5 mV down to −11.7 mV at the receiver output.

Figures 4A, 4B:
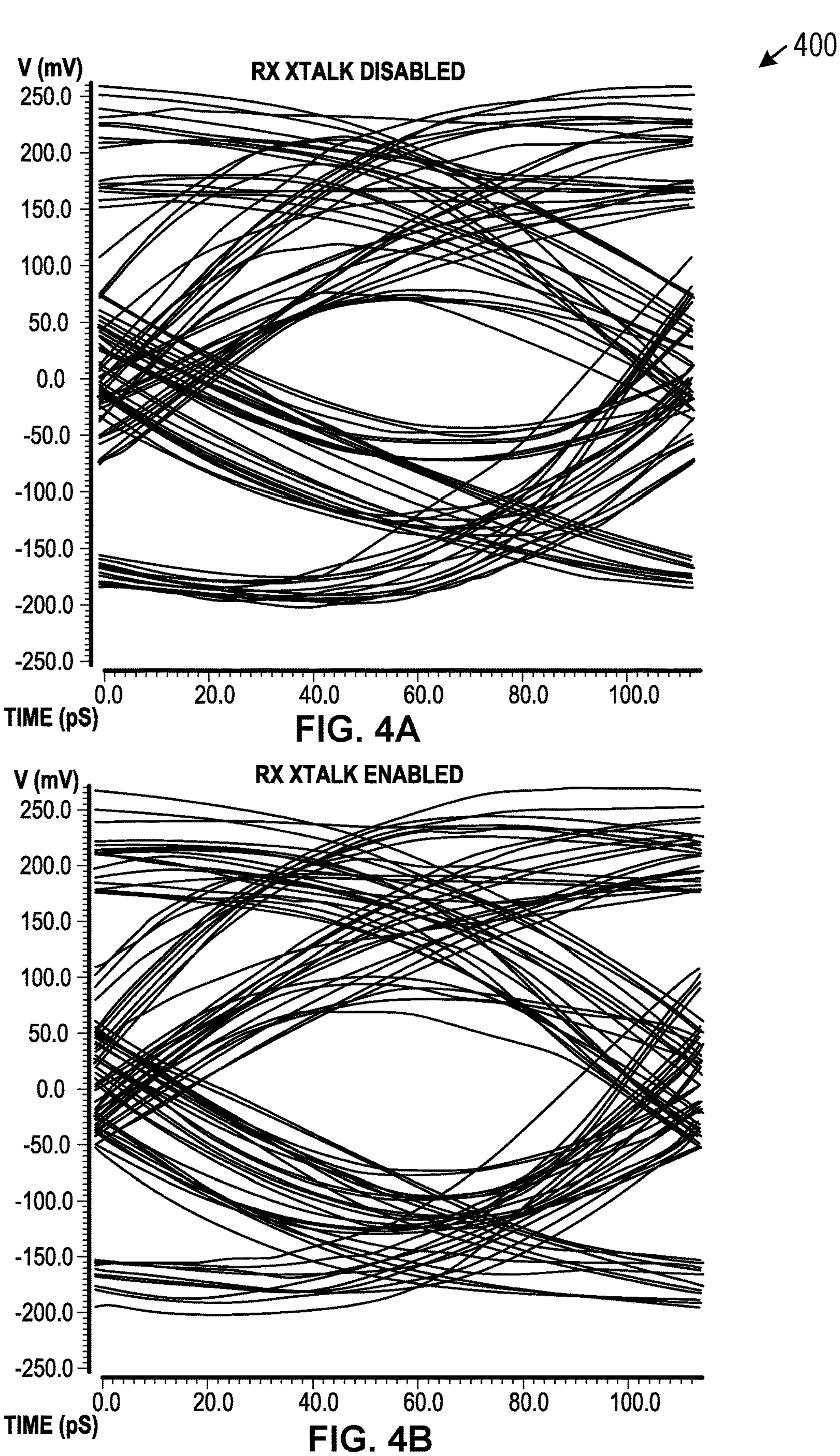
FIGS. 4A-4B are graphs illustrating eye diagrams, according to an embodiment.

FIGS. 4A-4B are graphs illustrating eye diagrams 400, according to an embodiment. FIG. 4A shows a channel simulation with a bit pattern at 8800 MTs without crosstalk cancellation, and FIG. 4B shows the same channel simulation with crosstalk cancellation applied. The application of the crosstalk cancellation may provide substantial improvement in the eye diagram, such as providing 30 mV eye height and 8 picosecond (pS) eye width improvement. The eye diagrams 400 show that the crosstalk cancellation discussed herein provides substantial channel performance improvement, including substantial reductions in the effects of crosstalk on channel noise and intersymbol interference.

Figure 5:
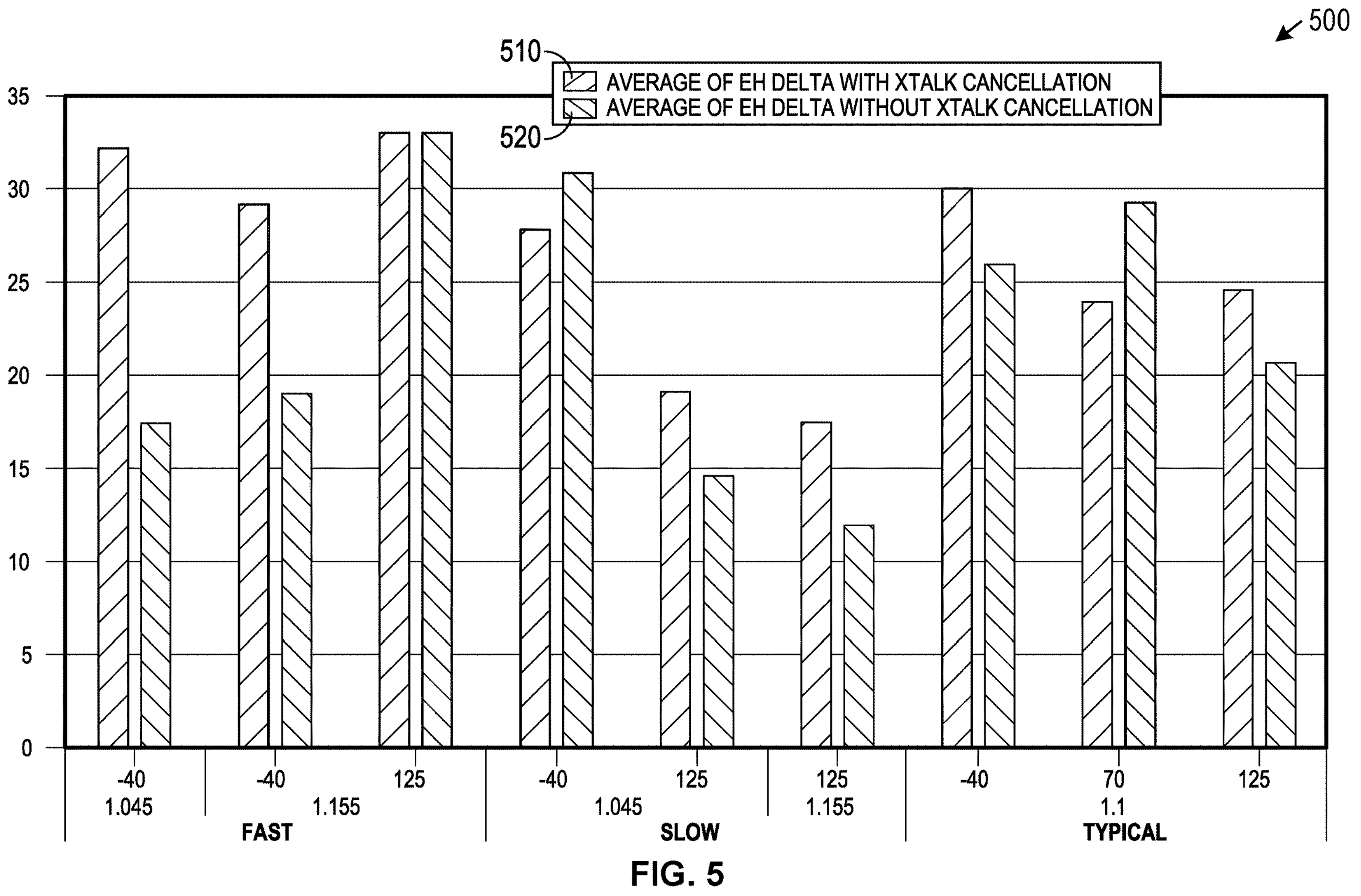
FIG. 5 is a graph illustrating eye height improvements, according to an embodiment.

FIG. 5 is a graph illustrating eye height improvements 500, according to an embodiment. The eye height improvements 500 compares the eye height (EH) delta with crosstalk cancellation 510 and without crosstalk cancellation 520 across process, voltage, and temperature (PVT) variations, including −40° C., 70° C., and 125° C. In the example shown in eye height improvements 500, the crosstalk cancellation 510 was associated with a reduced power consumption of 40%, while providing considerably less temperature and voltage sensitivity among crosstalk cancellation 510 (e.g., a 50% reduction in eye height variability). The crosstalk cancellation discussed herein is less complex than other solutions and provides improved performance at reduced power levels.

Figure 6:
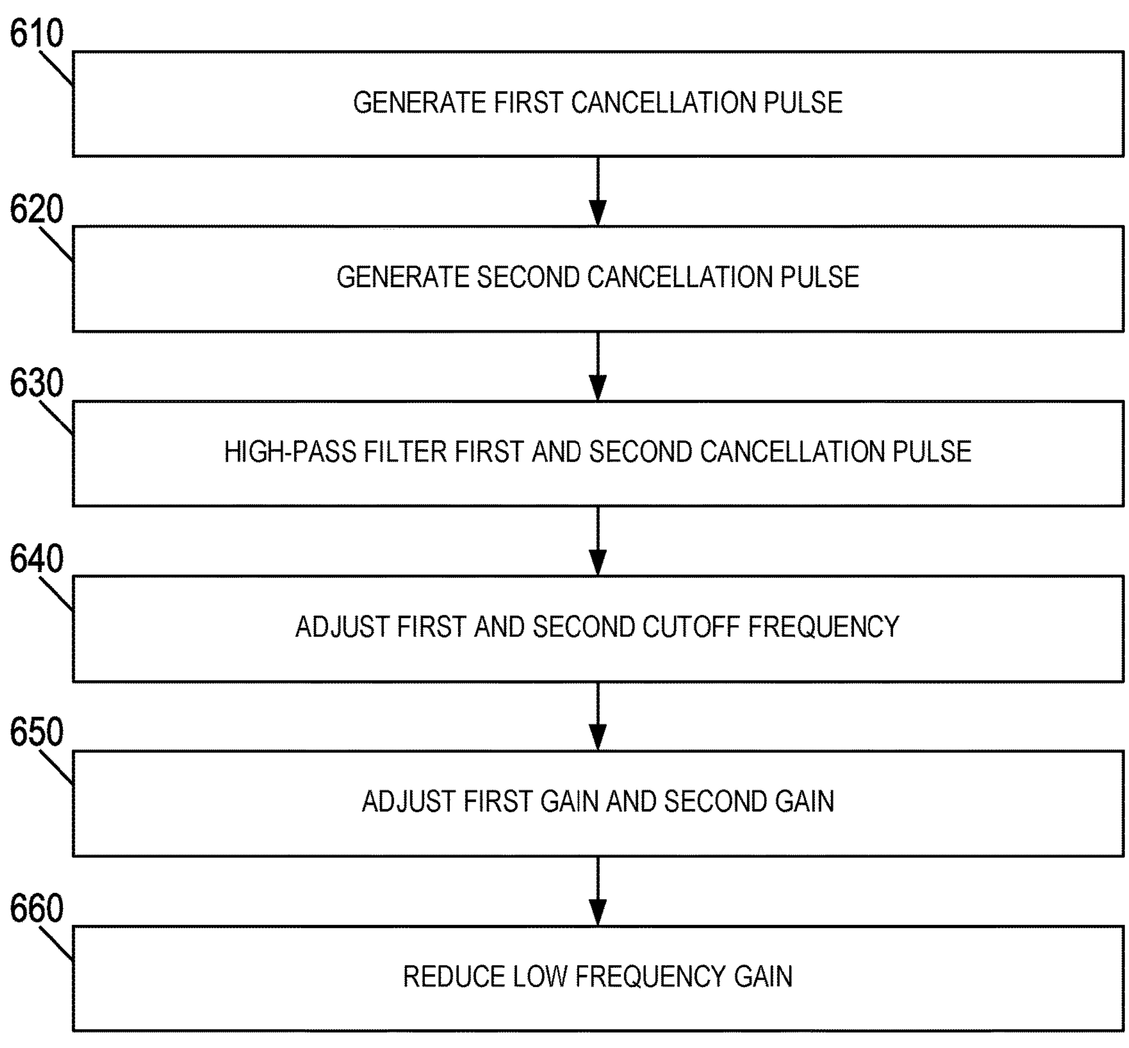
FIG. 6 is a flowchart illustrating a method for crosstalk cancellation, according to an embodiment.

FIG. 6 is a flowchart illustrating a method for crosstalk cancellation 600, according to an embodiment. Method 600 includes generating 610 a first cancellation pulse at a first transistor. The first cancellation pulse may be generated based on a first amplified victim signal received at a first transistor source node of the first transistor, and based on an aggressor signal received at a first transistor gate node of the first transistor. The first cancellation pulse may be used to cancel a first crosstalk pulse in the first amplified victim signal. Method 600 includes generating 620 a second cancellation pulse at a second transistor. The second cancellation pulse may be generated based on a second amplified victim signal received at a second transistor source node of the second transistor, and based on a voltage reference signal received at a second transistor gate node of the second transistor. The second cancellation pulse may be used to cancel a second crosstalk pulse in the second amplified victim signal.

Method 600 may include high-pass filtering 630 the first cancellation pulse and the second cancellation pulse. A high-pass filter may be used to provide this filtering 630. The high-pass filter may be coupled between a first transistor drain node of the first transistor and a second transistor drain node of the second transistor.

Method 600 may include adjusting 640 a first cutoff frequency of the first cancellation pulse and a second cutoff frequency of the second cancellation pulse. Adjusting 640 the first cutoff frequency may be based on a crosstalk capacitor trim input received at a tunable capacitor within the high-pass filter. Adjusting 640 the second cutoff frequency may also be based on the crosstalk capacitor trim input.

Method 600 may include adjusting 650 a first gain of the first cancellation pulse and a second gain of the second cancellation pulse. The first gain may be adjusted at a first tunable transistor based on a tunable transistor trim input received at the first tunable transistor. The second gain may be adjusted at a second tunable transistor based on the tunable transistor trim input received at the second tunable transistor. The first tunable transistor may include a first variable transistor source node coupled to the first transistor drain node and a first variable transistor gate node coupled to an n-bias signal. The second tunable transistor may include a second variable transistor source node coupled to the second transistor drain node and a second variable transistor gate node coupled to the n-bias signal.

Method 600 may include reducing 660 a low frequency gain of the first cancellation pulse and the second cancellation pulse. Reducing 660 the low frequency gain of the first cancellation pulse may include receiving the first amplified victim signal at a third transistor source node of a third transistor, receiving the voltage reference signal at a third transistor gate node of the third transistor, and reducing a first low frequency gain of the first cancellation pulse at the third transistor. Reducing 660 the low frequency gain of the second cancellation pulse may include receiving the second amplified victim signal at a fourth transistor source node of a fourth transistor, receiving the aggressor signal at a fourth transistor gate node of the fourth transistor, and reducing a second low frequency gain of the second cancellation pulse at the fourth transistor.

A third variable transistor source node of a third tunable transistor may be coupled to a third transistor drain node of the third transistor. A third variable transistor gate node of the third tunable transistor may be coupled to the n-bias signal. A fourth variable transistor source node of a fourth tunable transistor may be coupled to a fourth transistor drain node. A fourth variable transistor gate node of the fourth tunable transistor may be coupled to the n-bias signal.

Figure 7:
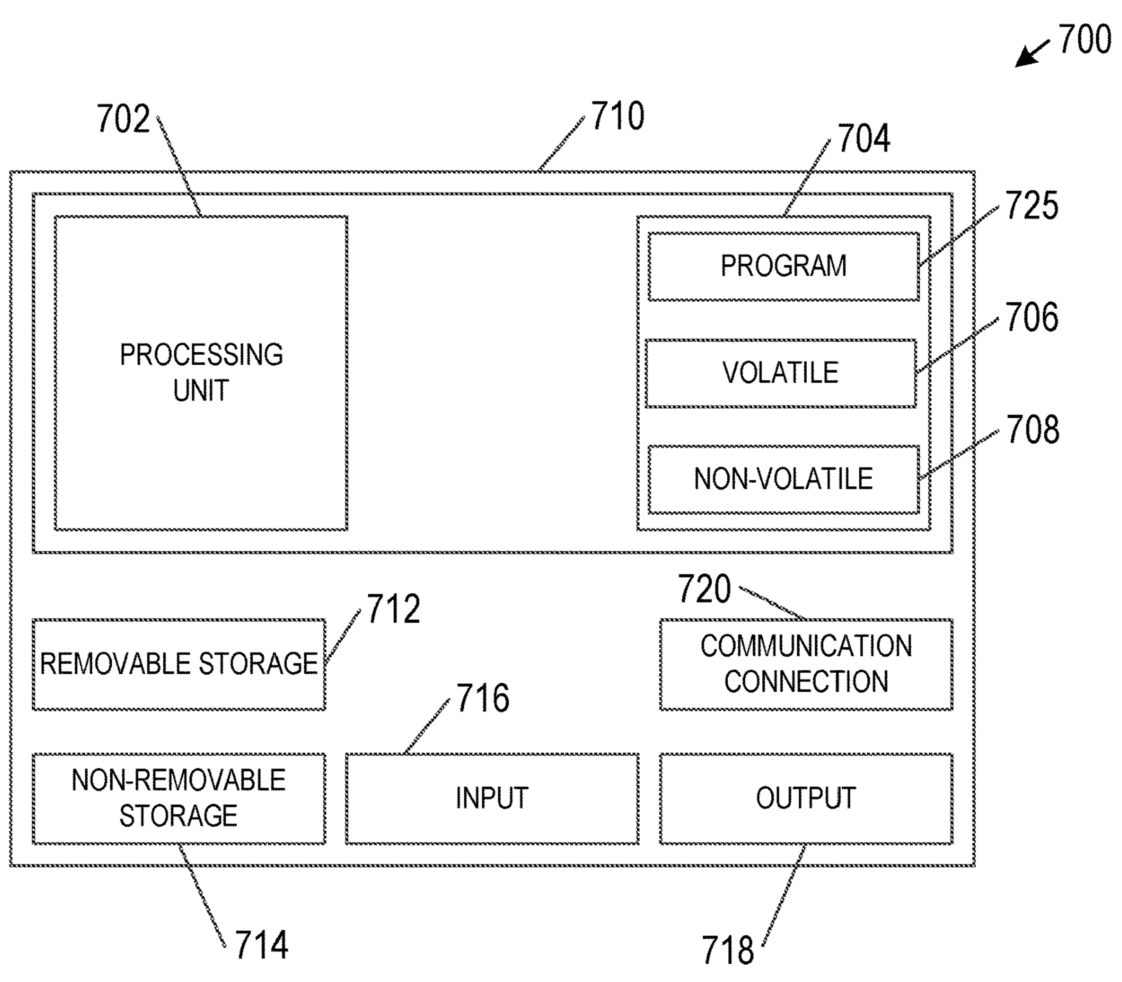
FIG. 7 is a block diagram of a computing device, according to an embodiment.

FIG. 7 is a block diagram of a computing device 700, according to an embodiment. The performance of one or more components within computing device 700 may be improved by including one or more of the circuits or circuitry methods described herein. Computing device 700 may include a first differential pair amplifier circuit including a first transistor and a second transistor. The first transistor may be used to receive a first amplified victim signal at a first transistor source node, receive an aggressor signal at a first transistor gate node, and generate a first cancellation pulse to cancel a first crosstalk pulse in the first amplified victim signal. The second transistor may be used to receive a second amplified victim signal at a second transistor source node, receive a voltage reference signal at a second transistor gate node, and generate a second cancellation pulse to cancel a second crosstalk pulse in the second amplified victim signal.

In one embodiment, multiple such computer systems are used in a distributed network to implement multiple components in a transaction-based environment. An object-oriented, service-oriented, or other architecture may be used to implement such functions and communicate between the multiple systems and components. In some embodiments, the computing device of FIG. 7 is an example of a client device that may invoke methods described herein over a network. In some embodiments, the computing device of FIG. 7 is an example of one or more of the personal computer, smartphone, tablet, or various servers.

One example computing device in the form of a computer 710, may include a processing unit 702, memory 704, removable storage 712, and non-removable storage 714. Although the example computing device is illustrated and described as computer 710, the computing device may be in different forms in different embodiments. For example, the computing device may instead be a smartphone, a tablet, or other computing device including the same or similar elements as illustrated and described with regard to FIG. 7. Further, although the various data storage elements are illustrated as part of the computer 710, the storage may include cloud-based storage accessible via a network, such as the Internet.

Returning to the computer 710, memory 704 may include volatile memory 706 and non-volatile memory 708. Computer 710 may include or have access to a computing environment that includes a variety of computer-readable media, such as volatile memory 706 and non-volatile memory 708, removable storage 712 and non-removable storage 714. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 710 may include or have access to a computing environment that includes input 716, output 718, and a communication connection 720. The input 716 may include one or more of a touchscreen, touchpad, mouse, keyboard, camera, and other input devices. The input 716 may include a navigation sensor input, such as a GNSS receiver, a SOP receiver, an inertial sensor (e.g., accelerometers, gyroscopes), a local ranging sensor (e.g., LIDAR), an optical sensor (e.g., cameras), or other sensors. The computer may operate in a networked environment using a communication connection 720 to connect to one or more remote computers, such as database servers, web servers, and another computing device. An example remote computer may include a personal computer (PC), server, router, network PC, a peer device or other common network node, or the like. The communication connection 720 may be a network interface device such as one or both of an Ethernet card and a wireless card or circuit that may be connected to a network. The network may include one or more of a Local Area Network (LAN), a Wide Area Network (WAN), the Internet, and other networks.

Computer-readable instructions stored on a computer-readable medium are executable by the processing unit 702 of the computer 710. A hard drive (magnetic disk or solid state), CD-ROM, and RAM are some examples of articles including a non-transitory computer-readable medium. For example, various computer programs 725 or apps, such as one or more applications and modules implementing one or more of the methods illustrated and described herein or an app or application that executes on a mobile device or is accessible via a web browser, may be stored on a non-transitory computer-readable medium.

The apparatuses and methods described above may include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the term “on” used with respect to two or more elements (e.g., materials), one “on” the other, means at least some contact between the elements (e.g., between the materials). The term “over” means the elements (e.g., materials) are in close proximity, but possibly with one or more additional intervening elements (e.g., materials) such that contact is possible but not required. Neither “on” nor “over” implies any directionality as used herein unless stated as such.

In the detailed description and the claims, a list of items joined by the term “at least one of” may mean any combination of the listed items. For example, if items A and B are listed, then the phrase “at least one of A and B” means A only; B only; or A and B. In another example, if items A, B, and C are listed, then the phrase “at least one of A, B and C” means A only; B only; C only; A and B (excluding C); A and C (excluding B); B and C (excluding A); or all of A, B, and C. Item A may include a single element or multiple elements. Item B may include a single element or multiple elements. Item C may include a single element or multiple elements.

In the detailed description and the claims, a list of items joined by the term “one of” may mean only one of the list items. For example, if items A and B are listed, then the phrase “one of A and B” means A only (excluding B), or B only (excluding A). In another example, if items A, B, and C are listed, then the phrase “one of A, B and C” means A only; B only; or C only. Item A may include a single element or multiple elements. Item B may include a single element or multiple elements. Item C may include a single element or multiple elements.

ADDITIONAL NOTES AND EXAMPLES

Example 1 is a system comprising: a first differential pair amplifier circuit including: a first transistor to: receive a first amplified signal at a first transistor source node; receive a crosstalk signal at a first transistor gate node; and generate a first cancellation pulse to cancel a first crosstalk pulse in the first amplified signal; and a second transistor to: receive a second amplified signal at a second transistor source node; receive a voltage reference signal at a second transistor gate node; and generate a second cancellation pulse to cancel a second crosstalk pulse in the second amplified signal.

In Example 2, the subject matter of Example 1 includes, wherein: the crosstalk signal includes an aggressor signal; and the first amplified signal includes a first amplified victim signal.

In Example 3, the subject matter of Examples 1-2 includes, the first differential pair amplifier circuit further including a high-pass filter coupled between a first transistor drain node of the first transistor and a second transistor drain node of the second transistor.

In Example 4, the subject matter of Example 3 includes, wherein the high-pass filter includes a tunable capacitor, the tunable capacitor to: receive a crosstalk capacitor trim input; adjust a first cutoff frequency of the first cancellation pulse based on the crosstalk capacitor trim input; and adjust a second cutoff frequency of the second cancellation pulse based on the crosstalk capacitor trim input.

In Example 5, the subject matter of Examples 3-4 includes, the first differential pair amplifier circuit further including: a first tunable transistor including a first variable transistor source node coupled to the first transistor drain node and a first variable transistor gate node coupled to an n-bias signal; and a second tunable transistor including a second variable transistor source node coupled to the second transistor drain node and a second variable transistor gate node coupled to the n-bias signal.

In Example 6, the subject matter of Example 5 includes, the first tunable transistor and the second tunable transistor to: receive a tunable transistor trim input; adjust a first gain of the first cancellation pulse at the first tunable transistor based on the tunable transistor trim input; and adjust a second gain of the second cancellation pulse at the second tunable transistor based on the tunable transistor trim input.

In Example 7, the subject matter of Examples 5-6 includes, a second differential pair amplifier circuit, the second differential pair amplifier circuit to reduce low frequency gain of the first cancellation pulse and the second cancellation pulse.

In Example 8, the subject matter of Example 7 includes, the second differential pair amplifier circuit including: a third transistor to: receive the first amplified signal at a third transistor source node; receive the voltage reference signal at a third transistor gate node; and reduce a first low frequency gain of the first cancellation pulse; and a fourth transistor to: receive the second amplified signal at a fourth transistor source node; receive the crosstalk signal at a fourth transistor gate node; and reduce a second low frequency gain of the second cancellation pulse.

In Example 9, the subject matter of Example 8 includes, the second differential pair amplifier circuit including: a third tunable transistor including a third variable transistor source node coupled to a third transistor drain node and a third variable transistor gate node coupled to the n-bias signal; and a fourth tunable transistor including a fourth variable transistor source node coupled to a fourth transistor drain node and a fourth variable transistor gate node coupled to the n-bias signal.

Example 10 is a method comprising: receiving a first amplified signal at a first transistor source node of a first transistor; receiving a crosstalk signal at a first transistor gate node of the first transistor; generating a first cancellation pulse at the first transistor, the first cancellation pulse to cancel a first crosstalk pulse in the first amplified signal; receiving a second amplified signal at a second transistor source node of a second transistor; receiving a voltage reference signal at a second transistor gate node of the second transistor; and generating a second cancellation pulse at the second transistor, the second cancellation pulse to cancel a second crosstalk pulse in the second amplified signal.

In Example 11, the subject matter of Example 10 includes, wherein: the crosstalk signal includes an aggressor signal; and the first amplified signal includes a first amplified victim signal.

In Example 12, the subject matter of Examples 10-11 includes, high-pass filtering the first cancellation pulse and the second cancellation pulse at a high-pass filter coupled between a first transistor drain node of the first transistor and a second transistor drain node of the second transistor.

In Example 13, the subject matter of Example 12 includes, receiving a crosstalk capacitor trim input at a tunable capacitor within the high-pass filter; adjusting a first cutoff frequency of the first cancellation pulse based on the crosstalk capacitor trim input; and adjusting a second cutoff frequency of the second cancellation pulse based on the crosstalk capacitor trim input.

In Example 14, the subject matter of Examples 12-13 includes, receive a tunable transistor trim input at a first tunable transistor and at a second tunable transistor; adjust a first gain of the first cancellation pulse at the first tunable transistor based on the tunable transistor trim input; and adjust a second gain of the second cancellation pulse at the second tunable transistor based on the tunable transistor trim input.

In Example 15, the subject matter of Example 14 includes, wherein: the first tunable transistor includes a first variable transistor source node coupled to the first transistor drain node and a first variable transistor gate node coupled to an n-bias signal; and the second tunable transistor including a second variable transistor source node coupled to the second transistor drain node and a second variable transistor gate node coupled to the n-bias signal.

In Example 16, the subject matter of Example 15 includes, reducing a low frequency gain of the first cancellation pulse and the second cancellation pulse.

In Example 17, the subject matter of Example 16 includes, receiving the first amplified signal at a third transistor source node of a third transistor; receiving the voltage reference signal at a third transistor gate node of the third transistor; reducing a first low frequency gain of the first cancellation pulse at the third transistor; receiving the second amplified signal at a fourth transistor source node of a fourth transistor; receiving the crosstalk signal at a fourth transistor gate node of the fourth transistor; and reducing a second low frequency gain of the second cancellation pulse at the fourth transistor.

In Example 18, the subject matter of Example 17 includes, wherein: a third variable transistor source node of a third tunable transistor is coupled to a third transistor drain node of the third transistor; a third variable transistor gate node of the third tunable transistor is coupled to the n-bias signal; a fourth variable transistor source node of a fourth tunable transistor is coupled to a fourth transistor drain node; and a fourth variable transistor gate node of the fourth tunable transistor is coupled to the n-bias signal.

Example 19 is a system comprising: an input differential equalizer circuit; a differential output circuit; and a crosstalk cancellation circuit to: receive a first amplified signal and a second amplified signal from the input differential equalizer circuit; receive a crosstalk signal from a crosstalk communication line; receive a voltage reference signal; and generate a differential cancellation signal based on the first amplified signal, the second amplified signal, the crosstalk signal, and the voltage reference signal.

In Example 20, the subject matter of Example 19 includes, the input differential equalizer circuit to generate the first amplified signal and the second amplified signal based on the crosstalk signal.

In Example 21, the subject matter of Example 20 includes, the crosstalk cancellation circuit including a first differential pair amplifier circuit including: a first transistor to: receive the first amplified signal at a first transistor source node; receive the crosstalk signal at a first transistor gate node; and generate a first cancellation pulse to cancel a first crosstalk pulse in the first amplified signal; and a second transistor to: receive a second amplified signal at a second transistor source node; receive the voltage reference signal at a second transistor gate node; and generate a second cancellation pulse to cancel a second crosstalk pulse in the second amplified signal.

In Example 22, the subject matter of Examples 19-21 includes, wherein: the crosstalk signal includes an aggressor signal; and the first amplified signal includes a first amplified victim signal.

In Example 23, the subject matter of Examples 21-22 includes, the first differential pair amplifier circuit further including a high-pass filter coupled between a first transistor drain node of the first transistor and a second transistor drain node of the second transistor.

In Example 24, the subject matter of Example 23 includes, wherein the high-pass filter includes a tunable capacitor, the tunable capacitor to: receive a crosstalk capacitor trim input; adjust a first cutoff frequency of the first cancellation pulse based on the crosstalk capacitor trim input; and adjust a second cutoff frequency of the second cancellation pulse based on the crosstalk capacitor trim input.

In Example 25, the subject matter of Examples 23-24 includes, the first differential pair amplifier circuit further including: a first tunable transistor including a first variable transistor source node coupled to the first transistor drain node and a first variable transistor gate node coupled to an n-bias signal; and a second tunable transistor including a second variable transistor source node coupled to the second transistor drain node and a second variable transistor gate node coupled to the n-bias signal.

In Example 26, the subject matter of Example 25 includes, the first tunable transistor and the second tunable transistor to: receive a tunable transistor trim input; adjust a first gain of the first cancellation pulse at the first tunable transistor based on the tunable transistor trim input; and adjust a second gain of the second cancellation pulse at the second tunable transistor based on the tunable transistor trim input.

In Example 27, the subject matter of Examples 25-26 includes, a second differential pair amplifier circuit, the second differential pair amplifier circuit to reduce low frequency gain of the first cancellation pulse and the second cancellation pulse.

In Example 28, the subject matter of Example 27 includes, the second differential pair amplifier circuit including: a third transistor to: receive the first amplified signal at a third transistor source node; receive the voltage reference signal at a third transistor gate node; and reduce a first low frequency gain of the first cancellation pulse; and a fourth transistor to: receive the second amplified signal at a fourth transistor source node; receive the crosstalk signal at a fourth transistor gate node; and reduce a second low frequency gain of the second cancellation pulse.

In Example 29, the subject matter of Example 28 includes, the second differential pair amplifier circuit including: a third tunable transistor including a third variable transistor source node coupled to a third transistor drain node and a third variable transistor gate node coupled to the n-bias signal; and a fourth tunable transistor including a fourth variable transistor source node coupled to a fourth transistor drain node and a fourth variable transistor gate node coupled to the n-bias signal.

Example 30 is at least one machine-readable medium including instructions that, when executed by processing circuitry, cause the processing circuitry to perform operations to implement of any of Examples 1-29.

Example 31 is an apparatus comprising means to implement of any of Examples 1-29.

Example 32 is a system to implement of any of Examples 1-29.

Example 33 is a method to implement of any of Examples 1-29.

The subject matter of any Examples above may be combined in any combination.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A system comprising:
- a first differential pair amplifier circuit including:
  - a first transistor to:
    - receive a first amplified signal at a first transistor source node;
    - receive a crosstalk signal at a first transistor gate node; and
    - generate a first cancellation pulse to cancel a first crosstalk pulse in the first amplified signal; and
  - a second transistor to:
    - receive a second amplified signal at a second transistor source node;
    - receive a voltage reference signal at a second transistor gate node; and
    - generate a second cancellation pulse to cancel a second crosstalk pulse in the second amplified signal.

2. The system of claim 1, wherein:
- the crosstalk signal includes an aggressor signal; and
- the first amplified signal includes a first amplified victim signal.

3. The system of claim 1, the first differential pair amplifier circuit further including a high-pass filter coupled between a first transistor drain node of the first transistor and a second transistor drain node of the second transistor.

4. The system of claim 3, wherein the high-pass filter includes a tunable capacitor, the tunable capacitor to:
- receive a crosstalk capacitor trim input;
- adjust a first cutoff frequency of the first cancellation pulse based on the crosstalk capacitor trim input; and
- adjust a second cutoff frequency of the second cancellation pulse based on the crosstalk capacitor trim input.

5. The system of claim 3, the first differential pair amplifier circuit further including:
- a first tunable transistor including a first variable transistor source node coupled to the first transistor drain node and a first variable transistor gate node coupled to an n-bias signal; and
- a second tunable transistor including a second variable transistor source node coupled to the second transistor drain node and a second variable transistor gate node coupled to the n-bias signal.

6. The system of claim 5, the first tunable transistor and the second tunable transistor to:
- receive a tunable transistor trim input;
- adjust a first gain of the first cancellation pulse at the first tunable transistor based on the tunable transistor trim input; and
- adjust a second gain of the second cancellation pulse at the second tunable transistor based on the tunable transistor trim input.

7. The system of claim 5, further including a second differential pair amplifier circuit, the second differential pair amplifier circuit to reduce low frequency gain of the first cancellation pulse and the second cancellation pulse.

8. The system of claim 7, further including the second differential pair amplifier circuit including:
- a third transistor to:
  - receive the first amplified signal at a third transistor source node;
  - receive the voltage reference signal at a third transistor gate node; and
  - reduce a first low frequency gain of the first cancellation pulse; and
- a fourth transistor to:
  - receive the second amplified signal at a fourth transistor source node;
  - receive the crosstalk signal at a fourth transistor gate node; and
  - reduce a second low frequency gain of the second cancellation pulse.

9. The system of claim 8, the second differential pair amplifier circuit including:
- a third tunable transistor including a third variable transistor source node coupled to a third transistor drain node and a third variable transistor gate node coupled to the n-bias signal; and
- a fourth tunable transistor including a fourth variable transistor source node coupled to a fourth transistor drain node and a fourth variable transistor gate node coupled to the n-bias signal.

10. A method comprising:
- receiving a first amplified signal at a first transistor source node of a first transistor;
- receiving a crosstalk signal at a first transistor gate node of the first transistor;
- generating a first cancellation pulse at the first transistor, the first cancellation pulse to cancel a first crosstalk pulse in the first amplified signal;
- receiving a second amplified signal at a second transistor source node of a second transistor;
- receiving a voltage reference signal at a second transistor gate node of the second transistor; and generating a second cancellation pulse at the second transistor, the second cancellation pulse to cancel a second crosstalk pulse in the second amplified signal.

11. The method of claim 10, wherein:

the crosstalk signal includes an aggressor signal; and the first amplified signal includes a first amplified victim signal.

12. The method of claim 10, further including high-pass filtering the first cancellation pulse and the second cancellation pulse at a high-pass filter coupled between a first transistor drain node of the first transistor and a second transistor drain node of the second transistor.

13. The method of claim 12, further including:

receiving a crosstalk capacitor trim input at a tunable capacitor within the high-pass filter;

adjusting a first cutoff frequency of the first cancellation pulse based on the crosstalk capacitor trim input; and adjusting a second cutoff frequency of the second cancellation pulse based on the crosstalk capacitor trim input.

14. The method of claim 12, further including:

receive a tunable transistor trim input at a first tunable transistor and at a second tunable transistor;

adjust a first gain of the first cancellation pulse at the first tunable transistor based on the tunable transistor trim input; and adjust a second gain of the second cancellation pulse at the second tunable transistor based on the tunable transistor trim input.

15. The method of claim 14, wherein:

the first tunable transistor includes a first variable transistor source node coupled to the first transistor drain node and a first variable transistor gate node coupled to an n-bias signal; and the second tunable transistor including a second variable transistor source node coupled to the second transistor drain node and a second variable transistor gate node coupled to the n-bias signal.

16. The method of claim 15, further including reducing a low frequency gain of the first cancellation pulse and the second cancellation pulse.

17. The method of claim 16, further including:

receiving the first amplified signal at a third transistor source node of a third transistor;

receiving the voltage reference signal at a third transistor gate node of the third transistor;

reducing a first low frequency gain of the first cancellation pulse at the third transistor;

receiving the second amplified signal at a fourth transistor source node of a fourth transistor;

receiving the crosstalk signal at a fourth transistor gate node of the fourth transistor; and reducing a second low frequency gain of the second cancellation pulse at the fourth transistor.

18. A system comprising:

an input differential equalizer circuit, the input differential equalizer circuit to generate the first amplified signal and the second amplified signal based on the crosstalk signal;

a differential output circuit; and a crosstalk cancellation circuit to:

receive a first amplified signal and a second amplified signal from the input differential equalizer circuit;

receive a crosstalk signal from a crosstalk communication line;

receive a voltage reference signal; and generate a differential cancellation signal based on the first amplified signal, the second amplified signal, the crosstalk signal, and the voltage reference signal.

19. The system of claim 18, the crosstalk cancellation circuit including a first differential pair amplifier circuit including:

a first transistor to:

receive the first amplified signal at a first transistor source node;

receive the crosstalk signal at a first transistor gate node; and generate a first cancellation pulse to cancel a first crosstalk pulse in the first amplified signal; and a second transistor to:

receive a second amplified signal at a second transistor source node;

receive the voltage reference signal at a second transistor gate node; and generate a second cancellation pulse to cancel a second crosstalk pulse in the second amplified signal.

* * * * *